United States Patent
Lu et al.

(10) Patent No.: US 6,857,795 B2
(45) Date of Patent: Feb. 22, 2005

(54) DEVELOPING APPARATUS AND METHOD FOR DEVELOPING ORGANIC ELECTROLUMINESCENT DISPLAY PANELS

(75) Inventors: Tien-Rong Lu, Tainan (TW); Yih Chang, Chung-Ho (TW)

(73) Assignee: RiTdisplay Corporation, Hsinchu (TW)

( * ) Notice: Subject to any disclaimer, the term of this patent is extended or adjusted under 35 U.S.C. 154(b) by 0 days.

(21) Appl. No.: 10/331,599

(22) Filed: Dec. 31, 2002

(65) Prior Publication Data

US 2003/0143491 A1 Jul. 31, 2003

(30) Foreign Application Priority Data

Dec. 31, 2001 (TW) ........................................ 90133358 A

(51) Int. Cl.[7] ............................. G03D 5/04; G03D 3/06; G03D 3/12
(52) U.S. Cl. ........................ 396/575; 396/578; 396/611; 396/616; 396/627; 396/631
(58) Field of Search ................................ 396/575, 578, 396/611, 627, 631

(56) References Cited

U.S. PATENT DOCUMENTS

| | | | |
|---|---|---|---|
| 3,710,703 A | * | 1/1973 | Bruno et al. |
| 4,142,194 A | * | 2/1979 | Hamlin |
| 4,145,135 A | * | 3/1979 | Sara |
| 4,428,659 A | * | 1/1984 | Howard |
| 6,343,882 B1 | * | 2/2002 | Chang et al. ............... 396/611 |

* cited by examiner

*Primary Examiner*—Richard L. Schilling
(74) *Attorney, Agent, or Firm*—Bacon & Thomas

(57) ABSTRACT

A developing apparatus for organic electroluminescent display panels comprises a developing unit for supplying a developing solution to be uniformly dispensed to the surface of an organic electroluminescent display panel by immersing the organic electroluminescent display panel into the developing solution or spreading the developing solution over the organic electroluminescent display panel, a cleaning unit having at least a bath connected to the end of the developing unit for spraying a recycled cleaning liquid or cleaning liquid over the organic electroluminescent display panel, a drying unit having at least an airflow driers, and a transporting unit for transporting the electroluminescent display panel; wherein the organic electroluminescent display panel is transported at a constant speed by the transporting unit of the developing apparatus.

12 Claims, 2 Drawing Sheets

DEVELOPING APPARATUS AND METHOD FOR DEVELOPING ORGANIC ELECTROLUMINESCENT DISPLAY PANELS

BACKGROUND OF THE INVENTION

1. Field of the Invention

The present invention relates to a developing apparatus and method for display panels, and more particularly to a developing apparatus and method suitable for organic electroluminescent (OEL) display panels.

2. Description of Related Art

Recently, the OEL displays become a focus of flat panel display devices market because of several advantages such as self-light-emitting, high brightness, high contrast, wide viewing angle, low driving voltage, fast response and compact structure. However, even samples of OEL displays fabricated in laboratories can achieve acceptable results, many problems in practical mass production of these OEL displays still need to be overcome.

A conventional passive OEL display panel includes a plurality of parallel stripes of indium tin oxide (ITO) functioning as anodes, a plurality of parallel isolation walls of photoresist which are frequently perpendicular to the stripes of anodes, at least a layer of an organic electroluminescent functional medium locating between any two adjacent isolation walls of photo resist, and a plurality of stripes of cathodes formed on the layer of organic electroluminescent functional medium. In most cases, the patterns of the anodes and pixel areas are further defined by a defining layer through developing, etching and stripping an exposed photo resist layer coated on said panels.

Although many anodes, cathodes and the isolation walls of the passive OEL display are formed through photolithography. However, as the size of OEL display increases, the conventional developing used in the manufacturing process cannot be applied well in the manufacturing process for medium-sized or large-sized OEL display panels. For the conventional development technology used in fabricating integrated circuits, the silicon substrate is mounted on spin chuck, the developing solution and water is dispensed from nozzles respectively as the silicon substrate is spun in a high speed. The developed silicon substrate is further dried as the developing quenches. But as the size of the display increases, the glass substrate of the display weighs much heavier than the conventional silicon wafer. Therefore, the conventional spin chuck designed for the silicon wafer cannot afford to sustain the weight of the glass substrate and the centrifugal force caused from the high-speed spin of the large-sized OEL panels. Hence, incomplete development accompanied with residual photo resist significantly reduces the yields of OEL display devices. Recently, the developing of OEL panels is suggested to go through a batch process to avoid the above problems. In the proposed batch process, the panel substrate of the display is immersed in a separate developing tank from rinsing bath. This batch process for developing OEL panel substrates cannot be achieved in a continuous manner since individual operators are required for the labor work to take out each display panel and re-load the same onto another machine. Hence, the processing time of development are inevitably prolonged. The batch processing still fails to exempt from the disadvantage for mass production and inconvenient for manufacturing large-sized display panel. In addition, labor work usually causes unexpected delaying or damages in the delivery of the OEL display panels. Hence, the time and quality for developing OEL panels cannot be accurately controlled through the conventional developing apparatus.

On the other hand, the known developing apparatus, in addition to the spin-coating developing apparatus, requires expensive and complicated sensors, controlling systems, reciprocating motion mechanisms and complicated controlling programs. The cost for purchasing these apparatus is very high. The maintenance of these equipments is also troublesome since complicate mechanism and complicated controlling system is needed. By the way, in most cases, the individual units in these apparatus remain in an idled situation for waiting the developed panels in some particular processing steps. Therefore, the efficiency for the application used for developing OEL panels is low. There is a need for providing a developing apparatus that is compact, easily to be maintained, and operable efficiently to reduce the running cost for the OEL display panels so as to meet the requirement for mass production and solve the problems in the developing process of the large-sized OEL display panels.

In other words, it is desirable to provide an improved apparatus for OEL display panels to mitigate and/or obviate the aforementioned problems.

SUMMARY OF THE INVENTION

The primary object of the invention is to provide a developing apparatus having a compact and simple structure to develop large-sized OEL display panels, which can be easily maintained and operable with a reduced running cost.

Another object of the invention is to provide a developing apparatus capable of developing large-sized OEL display panels in a continuous, highly efficient and fast manner without complicated mechanism.

The developing apparatus for organic electroluminescent display panels of the present invention comprises: a developing unit for supplying a developing solution and dispensing said developing solution uniformly to the surface of an organic electroluminescent display panels by immersing said organic electroluminescent display panel into said developing solution or spraying said developing solution over said organic electroluminescent display panels; a cleaning unit having at least a washing-bath, which locates and connects the end of said developing unit for spraying a recycled cleaning liquid or a fresh cleaning liquid over said organic electroluminescent display panels to remove said developing solution remaining on said surface of said organic electroluminescent display panels; a drying unit having at least an airflow drier, which locates and connects one end of said cleaning unit in order to dry said organic electroluminescent display panels after cleaning; and a transporting unit for transporting said electroluminescent display panels to go through said developing unit, said cleaning unit and said drying unit in a continuous manner; wherein said organic electroluminescent display panels are transported at a constant speed by said transporting unit of said developing apparatus.

A method for developing an organic electroluminescent display panel according to the present invention comprises the following steps: spraying a developing solution uniformly over the surface of said organic electroluminescent display panels in a developing tank, and said organic electroluminescent display panels are transported from one end of said developing tank to the other end of said developing tank at a constant speed; then pre-rinsing said organic electroluminescent display panels with recycled water; washing said organic electroluminescent display panels with deionized water; and drying said organic electroluminescent display panels by airflow; wherein the recycled water used for said pre-rinse is collected and recycled from the washed deionized water after said organic electroluminescent display panels are washed.

The developing time of the OEL panels in the developing unit of the present invention can be accurately controlled without expensive programmable timing controller ICs or complicate computer programs. The OEL panels in the developing unit are transported by a transporting unit (e.g. the set of rollers) at a constant speed. Therefore, the developing time of the OEL panels in the developing unit of the present invention can be well controlled through a predetermined combination of parameters such as the rotation speeds of the transporting-rollers and the arranged length of the developing unit. The predetermined time required for developing the OEL display panels is obtained through dividing the length of the developing unit by the speed of transporting the OEL display panel in the control of the transporting roller. The developing time of the developing apparatus according to the present invention can be exactly controlled by the simple adjustment of the transporting speed of the roller without the need for complicated controlling machines and programs. The quality of development of the developing apparatus according to the present invention is maintained by swaying the device for spraying the developing solution without the need for any pump, liquid level controller, or sensor. Furthermore, since no device for spin coating is used to spray the developing solution to the OEL display panel, thus, the difficulty for spinning a heavy substrate or the uniformity for coating the developing solution on a large-sized OEL panels involved in the conventional developing apparatus is no longer an critical issue in manufacture of the panels. Moreover, since the rollers at a constant speed make the transportation of the panels, and the panels are transported subsequently for development and rinse, the development processing of the panels can be effectively achieved in a continuous manner. Therefore, the development processing of the panels achieved by the apparatus of the present invention is suitable for mass production.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
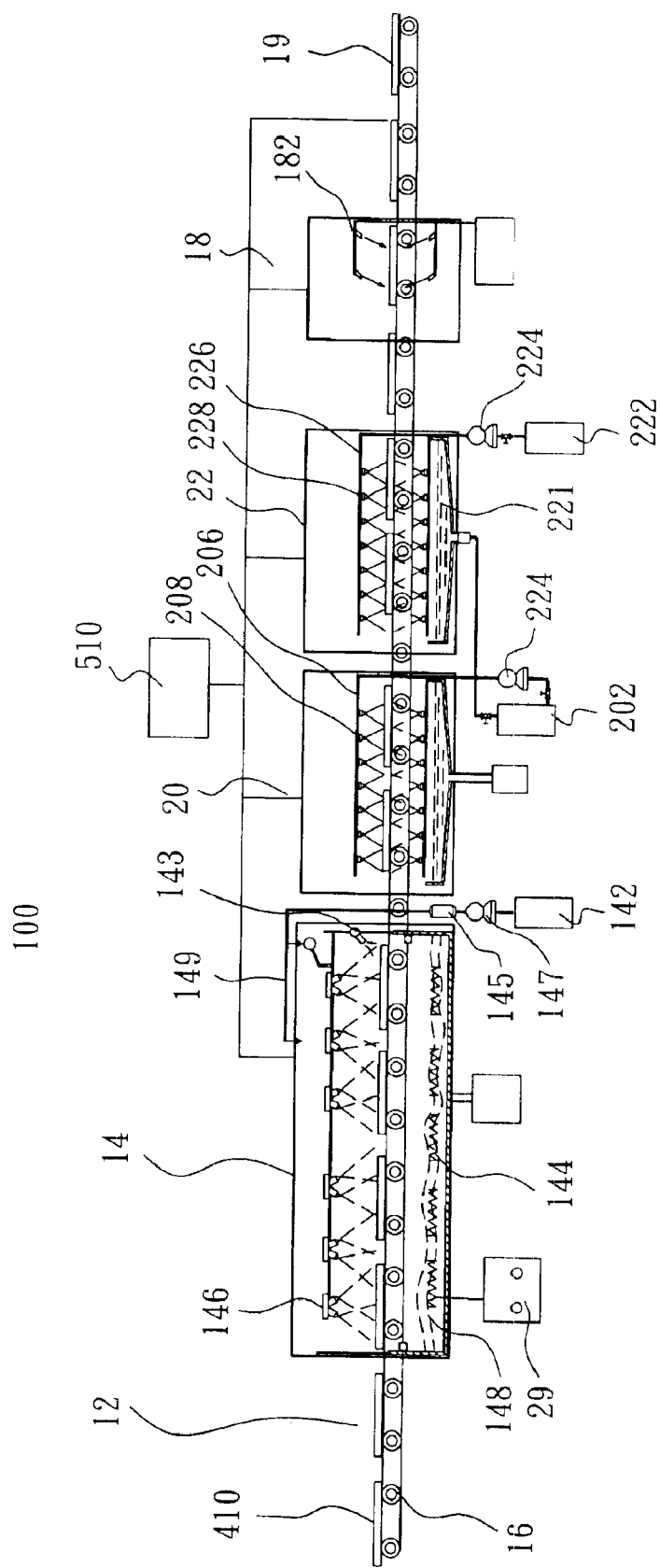
FIG. 1 is a schematic view of a developing apparatus for OEL display panels according to a preferred embodiment of the present invention.

The OEL display panel according to the present invention may selectively further comprise an unloading unit locating and connecting one end of the drying unit to convey the display panels after developing, or alternatively, to provide a buffer zone to transport the developed panels to the subsequent processes. The developing apparatus for OEL display panels of the present invention may selectively further comprise a controlling unit to control or adjust the speed of transporting the OEL display panel in the transporting unit. In addition, for controlling or maintaining the temperature of the developing tank, the developing unit of the developing apparatus for OEL display panels according to the present invention may selectively further comprise a temperature controlling device to control or maintain the temperature of the developing tank. The developing unit of the present invention may also selectively further comprises a device for spraying developing solution uniformly to the OEL display panel during transportation. Preferably, the devices for spraying the developing solution are nozzles equipped in a N*M array to spray the developing solution in a crossfire manner on the OEL panels, wherein said N and said M are the quantity of said spraying devices and said nozzles, respectively, and said N and said M are integers greater than 0. The nozzles for spraying developing solution preferably sway back and forth as the developing solution is sprayed uniformly to the panels. Furthermore, the developing unit can selectively comprise at least a collecting tank for reserving or recycling the developing solution. Preferably, the collecting tank is connected to the device for spraying the developing solution; or alternatively, the developing unit may selectively further comprise at least a concentration detector for controlling or monitoring the concentration of the developing solution. Further, the developing unit may selectively comprise a supplementary device for automatically supplying developing solution if it's necessary.

The cleaning unit of the developing apparatus for OEL display panels according to the present invention comprises at least a bath. Preferably, the bath of the present invention are a first washing-bath and a second washing-bath wherein the OEL display panels is pre-rinsed in the first washing-bath and then is washed in the second washing-bath. The cleaning liquid used for cleaning the panels in the second washing-bath is collected or recycled for the pre-rinse in the first washing-bath. The cleaning liquid used for the cleaning unit is not limited, and preferably, deionized water is used to clean the OEL display panels in the second washing-bath. The cleaning liquid used in the first washing-bath is not limited, and preferably, deionized water or deionized water recycling from the second washing-bath is used in the first washing-bath. The transporting unit of the developing apparatus for OEL display panels according to the present invention is not limited. Preferably, the transporting unit is a set of transporting rollers. Most preferably, the transporting unit is a set of transporting rollers having fringes with an inner diameter smaller than the outer diameter to load the OEL display panels. The developing solution suitable for the developing apparatus for OEL display panels is not limited, depending on the layer required for development over the OEL display panels. Preferably, the developing solution is tetramethyl-ammmonium hydroxide (TMAH) solution or sodium hydroxide (NaOH) solution. The OEL display panel suitable for the developing apparatus for the OEL display panels is not limited, and preferably, the OEL display panel has at least a photo resist layer or polyimide layer on the surface thereof. The airflow dry device of the drying unit of the developing apparatus for OEL display panels is not limited. Preferably, the airflow dry device of the drying unit of the developing apparatus is an air-knife module. The developing apparatus can be applied not only to the passive OEL (including the small-molecular OLED and PLED) panels but also to the active matrix OEL panels.

Please referring to FIG. 1, FIG. 1 is a schematic view of a developing apparatus 100 for OEL display panels according to a preferred embodiment of the present invention. The developing apparatus 100 for OEL display panels has a developing unit 14 connected to a first cleaning unit 20, a second cleaning unit 22 and a drying unit 18 in subsequence.

Each of the units is connected by a transporting unit of rollers for transporting the organic electroluminescent panels to each unit. The developing unit 14 has a developing tank 148 and an array of nozzles 146 mounted above the developing tank 148. The array of nozzles 146 can sway back and forth to spray developing solution uniformly over the panel or spray developing solution into the developing tank 148. The developing unit 14 is mounted outside the developing tank 148, and is equipped with one or a plurality of collecting tanks 142 for reserving developing solution. The developing solution reserved in the tanks 142 may be either identical to or different from each other, such as TMAH or NAOH, depending on the panel required for development. This arrangement is used to avoid the developing solution from contamination with respect to each other. Alternatively, the collecting tanks can serve as an auxiliary tank for the other tanks to replace or refill the developing solution without shutting down the machine. Each developing solution collecting tank can selectively connect a supplementary system for automatically supplying developing solution from outside when the developing solution is in short of supply. The developing solution collecting tank is connected to the array of nozzles 146 of the developing unit through pipe line 149. Optionally, a filter 146 or pump 147 can be mounted within the pipe line 149 to filter impurity of the developing solution or control the pressure of spraying the developing solution. The quality of the development processing can be controlled by adjusting the pressure of spraying the developing solution. The array of nozzles 146 sways and sprays the developing solution in a crossed manner to enhance uniformity of the development. The developing tank 148 further contains a temperature controller 144 for controlling or maintaining the temperature of the developing tank 148 during the development processing of the panels.

A first washing-bath 201 is connected to the end of the developing tank 148, and a second washing-bath 221 is connected to the end of the first washing-bath 201. Both the first and second washing-baths are equipped with clean water collecting tank (202, 222), pumps (204, 224), pipe lines (206, 226) connected and nozzles (208, 228). The water for rinse is pumped by pumps (204, 224) from the clean water collecting tank (202, 222) to the nozzles (208, 228) through the pipe lines (206, 226) during treatment of the OEL display panels, and sprays over the surface of the OEL display panels from the nozzles (208, 228) to clean the developing solution remaining on the surface of the OEL display panels. Clean deionized water is used in the second washing-bath 221 to rinse and wash the OEL display panels. The water after rinsing and washing in the second washing-bath can be collected in the collecting tank 202, and then, is supplied to the first washing-bath 201 with pipe lines connected between the two baths so that the first washing-bath 210 can use the recycled water to clean the OEL display panels. An airflow drying unit 18 having a plurality of air-knifes or an array of air-knifes is connected to the end of the second washing-bath 221. Airflow blows from the nozzles 182 of the drying unit 18 onto the surface of the OEL display panels to remove the remaining moisture or contamination particle.

The OEL display panel of the present developing apparatus 100 is transported by means of transporting roller system 16. The speed of the transportation is obtained and set by dividing the length of the developing tank by the time required for the development processing. When the OEL display panel passes the developing tank of the developing unit, the nozzles of the developing unit sway to spray the developing solution spray uniformly over the surface of the OEL display panel. Since the OEL panels are transported at a constant speed in eth developing unit, the developing time is equal to the period of time that the OEL display panel stays in the developing tank. The period of time that the OEL display panels staying in the developing tank can be finely controlled by either adjusting the speed of the transporting roller 16 or changing the length of the developing tank. After a fine control of the developing time is achieved, the developed OEL display panels are transported to the first washing-bath 201 by means of the set of transporting rollers 16. The nozzles 208 of the first washing-bath 201 spray the recycled water over the surface of the OEL display panels to remove contamination particles and developing solution on the OEL display panel. The deionized water used in the second washing-bath 221 is collected and recycled after rinsing and washing for supplying further rinsing in the first washing-bath 201. After rinsing in the first washing-bath 201 is achieved, the OEL display panel is transported to the second washing-bath 221 by means of transporting roller 16, being rinsed with clean deionized water. After the washing in the second washing-bath, the OEL display panel is transported to the drying unit 18 by means of the transporting rollers. The drying unit 18 has a plurality of air-knifes 182 so that fresh air can be blew to the surface of the OEL display panel to remove the moisture remaining on the OEL display panel for subsequent processing.

The developing apparatus for OEL display panels according to the present invention also connects a buffer zone 12 in front of the developing tank to place the OEL display panel to be developed and to wait for transportation to the developing unit 14. In addition, an air-knife 143 is mounted between the developing tank 148 and the first washing-bath 201 to preliminary blow off the remaining developing solution and particles. Furthermore, a second buffer zone 19 is mounted to connect the drying unit 18 to place the developed OEL display panel and wait for transportation to the subsequent unit.

Figure 2:
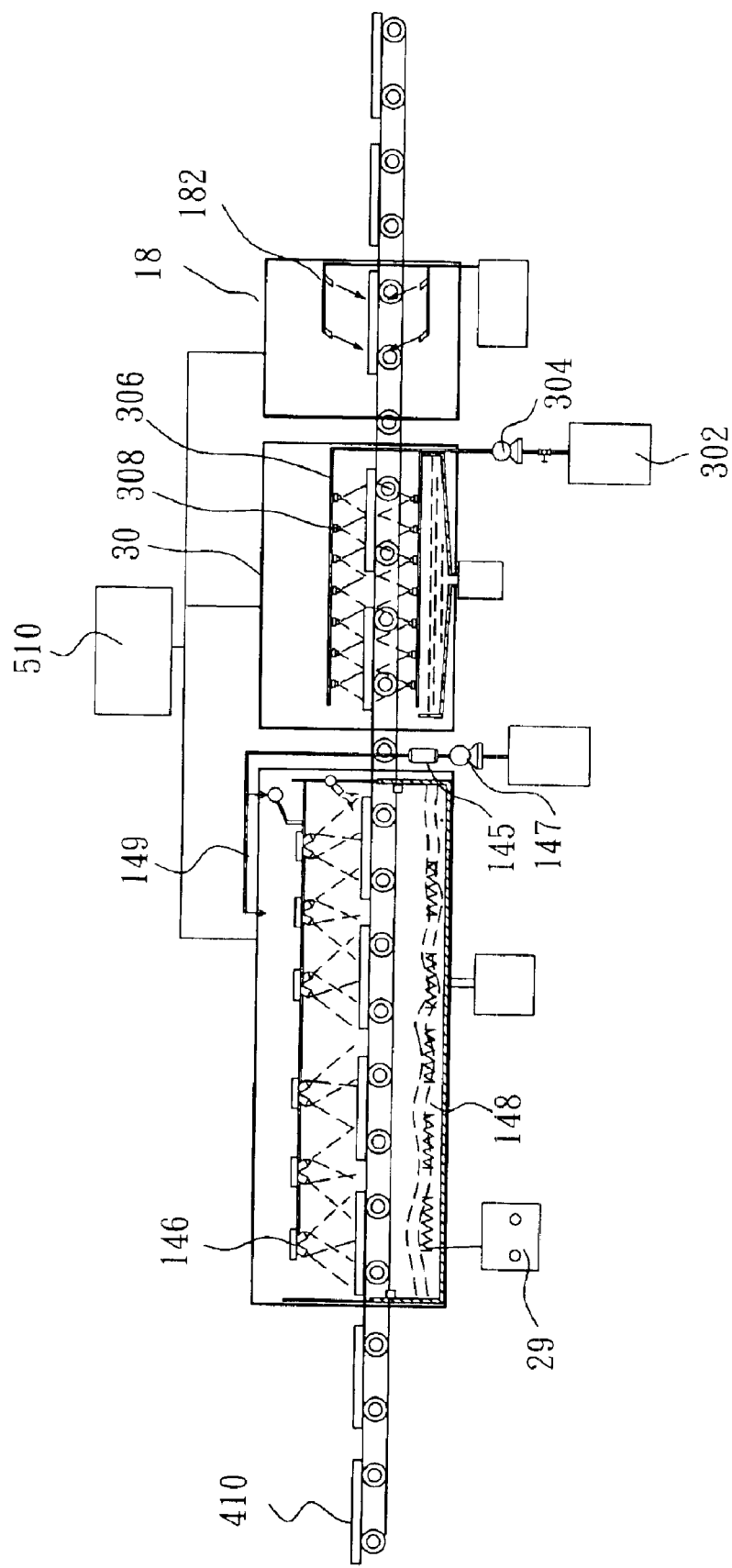
FIG. 2 is a schematic view of a developing apparatus for OEL display panels according to another preferred embodiment of the present invention.

Referring now to FIG. 2, FIG. 2 is a schematic view of the developing apparatus for OEL display panels according to another embodiment of the present invention. Except for the cleaning unit, the developing apparatus for OEL display panels of FIG. 2 is the same as the developing apparatus for OEL display panels of FIG. 1. The preferred embodiment of the developing apparatus for OEL display panels as shown in FIG. 2 employs only one cleaning unit 30. The cleaning unit 30 is equipped with clean water collecting tank 302, pump 304, pipe line 306 connected and nozzles 308. The water for washing is pumped by pumps 304 from the clean water collecting tank 302 to the nozzles 308 through the pipe line 306 for the washing of the developed OEL display panels, and sprays over the surface of the OEL display panels from the nozzles 308 to clean the developing solution remaining on the surface of the OEL display panels. Clean deionized water is used in the bath 301 to wash the OEL display panels.

The developing apparatus for OEL display panels according to the present invention adopts not only the transporting rollers to transport the OEL display panels but also the nozzle that sways back and forth to spray the developing solution uniformly over the panels. Hence, the apparatus of the present invention overcomes the conventional drawbacks in the conventional spin coating, which is not suitable for the large-sized OEL display panels. Furthermore, developing apparatus for OEL display panels according to the present invention uses the constant speed of transporting roller to control the developing time. The calculation way and the adjusting of the predetermined constant speed provided by the present invention is much more simple and economic. Moreover, the simplified structure of the developing apparatus of the present invention is very compact to significantly reduce running cost without huge expense for complicated controllers, programers and hardware designs. Maintenance of the developing apparatus becomes simple and easy as compared with the known apparatus. The developing time can be adjusted by controlling the speed of the roller. Hence, it is easy and exact for the developing apparatus of the present invention to control the developing time.

Although the present invention has been explained in relation to its preferred embodiment, it is to be understood that many other possible modifications and variations can be made without departing from the spirit and scope of the invention as hereinafter claimed.

What is claimed is:

1. A developing apparatus for organic electroluminescent display panels, comprising:

a developing unit having a developing tank for supplying a developing solution and at least a spraying device for dispensing said developing solution uniformly to the surface of organic electroluminescent display panels, wherein said spraying devices are nozzles arranged in a N*M array for spraying said developing solution on said organic electroluminescent display panels in a crossed manner, said nozzles sway back and forth as said developing solution is sprayed, and said N and said M are the quantity of said spraying devices and said nozzles, respectively, and said N and said M are integers greater than 0;

a cleaning unit having a first washing-bath and a second washing-bath, wherein the cleaning liquid used for cleaning said organic electroluminescent display panels in said second washing-bath is collected or recycled for the pre-rinse in said first washing-bath, which locates and connects the end of said developing unit, and said organic electroluminescent display panels is pre-rinsed in said first washing-bath and then is washed in said second washing-bath;

a drying unit having at least an airflow drier, which locates and connects one end of said cleaning unit in order to dry said organic electroluminescent display panels after cleaning; and a transporting unit for transporting said electroluminescent display panels to go through said developing unit, said cleaning unit and said drying unit in a continuous manner;

wherein said organic electroluminescent display panels are transported at a constant speed by said transporting unit of said developing apparatus.

2. The developing apparatus as claimed in claim 1, wherein said developing apparatus further comprises an unloading unit locating and connecting at one end of said drying unit to convey said display panels after developing, or alternatively, provides a buffer zone for delivering said organic electroluminescent display panels to the subsequent processes.

3. The developing apparatus for organic electroluminescent display panels as claimed in claim 1, further comprising a controlling unit to control or adjust the speed for transporting said organic electroluminescent display panels.

4. The developing apparatus for organic electroluminescent display panels as claimed in claim 1, wherein said developing unit further comprises at least a temperature controlling device to control or maintain the temperature of said developing unit.

5. The developing apparatus for organic electroluminescent display panels as claimed in claim 1, wherein said developing unit further comprises at least a collecting tank for reserving or recycling said developing solution, and said collecting tank is connected to said spraying device for dispensing said developing solution.

6. The developing apparatus for organic electroluminescent display panels as claimed in claim 1, wherein said developing unit further comprises at least a concentration detector for controlling or monitoring the concentration of said developing solution.

7. The developing apparatus for organic electroluminescent display panels as claimed in claim 1, wherein said developing unit further comprises a supplementary device for automatically supplying said developing solution.

8. The developing apparatus for organic electroluminescent display panels as claimed in claim 1, wherein deionized water is used to clean said organic electroluminescent display panels in said second washing-bath.

9. The developing apparatus for organic electroluminescent display panels as claimed in claim 1, wherein said transporting unit is a plurality of transporting rollers.

10. The developing apparatus for organic electroluminescent display panels as claimed in claim 1, wherein said developing solution is tetramethyl-ammonium hydroxide (TMAH) solution or sodium hydroxide (NaOH) solution.

11. The developing apparatus for organic electroluminescent display panels as claimed in claim 1, wherein said airflow dry device is an air-knife module.

12. The developing apparatus for organic electroluminescent display panels as claimed in claim 1, wherein said organic electroluminescent display panels, are coated with at least a photo resist layer or polyimide layer on the surface thereof.

* * * * *